(12) United States Patent
Horiuchi et al.

(10) Patent No.: US 6,433,474 B1
(45) Date of Patent: Aug. 13, 2002

(54) CURRENT INJECTION-TYPE DIAMOND ULTRAVIOLET LIGHT-EMITTING DEVICE

(75) Inventors: Kenji Horiuchi, Kawasaki; Kazuo Nakamura, Yokohama; Satoshi Yamashita, Tokyo, all of (JP)

(73) Assignee: Tokyo Gas Co., Ltd., Tokyo (JP)

( * ) Notice: Subject to any disclaimer, the term of this patent is extended or adjusted under 35 U.S.C. 154(b) by 174 days.

(21) Appl. No.: 09/596,979

(22) Filed: Jun. 20, 2000

Related U.S. Application Data

(63) Continuation of application No. PCT/JP98/05998, filed on Dec. 28, 1998.

(30) Foreign Application Priority Data

Dec. 29, 1997 (JP) ............................................. 9-368237

(51) Int. Cl.[7] ................................................. H01J 1/62
(52) U.S. Cl. ...................................... 313/499; 313/503
(58) Field of Search .................................. 313/499, 503, 313/504; 257/79, 77, 103; 438/22, 105, 931

(56) References Cited

U.S. PATENT DOCUMENTS 5,420,879 A * 5/1995 Kawarada et al. ............ 372/41

FOREIGN PATENT DOCUMENTS

| GB | 2 239 011 A | 6/1991 |
|---|---|---|
| JP | 02017631 | 1/1990 |
| JP | 4-240784 A | 8/1992 |
| JP | 5-140550 A | 6/1993 |
| JP | 05200271 A | 8/1993 |
| JP | 06326355 A | 11/1994 |
| JP | 07283434 A | 10/1995 |
| JP | 07307487 A | 11/1995 |
| JP | 08330624 A | 12/1996 |

OTHER PUBLICATIONS

P.J. Dean, et al., *Intrinsic and Extrinsic Recombination Radiation from Natural and Synthetic Aluminum–Doped Diamond*, Physical Review, vol. 140, No. 1A, Oct. 4, 1965, pp. 352–368.
R.M. Chrenko, et al., *Dispersed Paramagnetic Nitrogen Content of Large Laboratory Diamonds*, The Philosophical Magazine, vol. 23, No. 183, Mar. 1971, pp. 313–318.
Hisao Kanda, et al., *Growth of Diamond at High Temperatures and Pressures*, Chemistry of Inorganic Materials, No. 9, Apr. 1981, pp. 1349–1355.
H. Sumiya, S. Satoh, *High–Pressure Synthesis of High–Purity Diamond Crystal*, Diamond and Related Materials, 5 (1996), pp. 1359–1365.
K. Hyashi et al, *Electro–Optical Characteristics of Hydrogenated Diamond Thin Film*, New Diamond, vol. 13, No. 3, Jul. 25, 1997, pp. 7–13.

* cited by examiner

*Primary Examiner*—Robert H. Kim
*Assistant Examiner*—Jurie Yun
(74) *Attorney, Agent, or Firm*—Workman, Nydegger & Seeley

(57) ABSTRACT

A current injection-type diamond ultraviolet light-emitting device is provided that achieves the diamond free exciton recombination radiation by forming electrodes on a high-quality diamond crystal and applying a DC voltage between electrodes to inject carriers. A diamond crystal can be selected in terms of photoluminescent spectrum at room temperature and the half width of the Raman scattering peak intrinsic to the diamond.

65 Claims, 7 Drawing Sheets

CURRENT INJECTION-TYPE DIAMOND ULTRAVIOLET LIGHT-EMITTING DEVICE

This application is a continuation of International Application No. PCT/JP98/05998, filed Dec. 28, 1998, which for purpose of disclosure is incorporated herein by specific reference.

BACKGROUND OF THE INVENTION

1. Field of the Invention

The present invention relates to a light-emitting device with the use of a diamond, for emitting ultraviolet light, that can be used in fields of optical information recording/read out processing, photolithography, optical working, fluorescent light sources, etc.; more specifically, a current injection-type diamond ultraviolet light-emitting device that emits ultraviolet light due to excitation by the injection of current.

Since the ultraviolet light has a short wavelength and find processing can be performed with this light, various demands for this light have been increasing. For example, there are applications in increasing memory density by using the light for optical recording/read out processing, increasing packing density by using the light for semiconductor find processing equipment, etc.

2. Description of the Related Art

For sources of this ultraviolet light, one may point out a deuterium lamp, an excimer laser, etc. However, the deuterium lamp has a poor efficiency in ultraviolet emission and low brightness. Further, since the excimer lasers employ gases, they are of a large size and need water-cooling and hence inconvenient to handle with. In addition, some excimer lasers employ hazardous substances (halogen). As described above, the use of conventional ultraviolet light sources causes much inconvenience.

Further, a diamond is also known to be a material capable of emitting the ultraviolet light. The diamond ultraviolet light-emitting device is of a small size, efficient, highly bright, and also excellent in safety.

Conventional diamond light-emitting devices are described in, for example, (1) Japanese Patent Application Laid-open No. 4-240784, (2) Japanese Patent Application Laid-open No. 7-307487, (3) Japanese Patent Application Laid-open No. 8-330624, etc.

However, in the conventional diamond light-emitting devices, diamond crystals comprising luminescent layers have poor quality, containing many impurities and defects therein. Due to this fact, ultraviolet emissions originating in the impurities and lattice defects are dominant, and therefore free exciton recombination radiation of a short wavelength that is intrinsic to the diamond and observable only when the impurities and defects are sufficiently reduced is not dominant. For example, in the embodiment (FIG. 9) of the Japanese Patent Application Laid-open No. 7-307487, a peak of the 238 nm wavelength is dominant. This particular emission has been determined to be a recombination radiation of an exciton bounded at boron, hence originating in the impurity still. Therefore, conventional diamond light-emitting devices bear problems to be solved as below. That is, (1) When the diamond light-emitting device is constructed as a current injection-type light-emitting device, ultraviolet emission originating in the impurities or lattice defects is dominant and the free exciton recombination radiation of a shorter wavelength (wavelength of 235 nm etc.) that is intrinsic to the diamond and most advantageous in a practical point of view cannot exhibit sufficient emission intensity. Therefore it is impractical to use it as an actual light-emitting device.

(2) Further, the conventional diamond light-emitting devices are considered on the basis of the ultraviolet emission originating in the impurities or lattice defects, and therefore the amount of dopant is examined only in terms of the control of the conductivity of the crystal. Consequently, nothing has been examined regarding the existence of the allowable maximum amount of a dopant for creating the conductivity of the diamond that does not hinder the free exciton recombination radiation effectively.

(3) Further, since the conventional diamond light-emitting devices are dependent on the ultraviolet emissions originating in the impurities and lattice defects, a composition and a growth sector of the diamond crystal have been poorly investigated and optimization of its crystallinity and the controlling of wavelength based on alteration of isotopic composition ratio of the diamond have not been tried.

SUMMARY OF THE INVENTION

Therefore, it is an object of the present invention to solve the above-described problems and provide an injection current-operated diamond ultraviolet light-emitting device in which the free exciton recombination radiation intrinsic to the diamond and having a shorter wavelength is dominant.

DESCRIPTION OF THE INVENTION

With an aim to achieve the above-described object, the diamond light-emitting device according to the present invention is a diamond ultraviolet light-emitting device comprising a luminescent layer composed of a diamond capable of emitting light at a given wavelength due to excitation by the injection of current, characterized in that the diamond light-emitting device has a luminescent layer comprising a diamond in which occurs an emission such that free excitation recombination radiation due to excitation by the injection of current is dominant. Here, a diamond in which occurs an emission such that the free exciton recombination radiation by the injection of current is dominant means a high-quality diamond with few impurities and few lattice defects except dopants. Further, an emission such that the free exciton recombination radiation is dominant means emission whose emission intensity originating in the free exciton recombination is at least twice as large as the emission intensity originating in the impurities.

Preferably, such a diamond comprises a diamond crystal fabricated by the high-temperature and high-pressure method using a flux with an impurity getter added in. Here, the above-described impurity getter is preferably a nitrogen getter. The reason for this is that nitrogen in the diamond, in addition to the lattice defects, adversely affects the free exciton recombination radiation in particular. Therefore, it is desirable that the amount of nitrogen contained in the diamond crystal is controlled to be no more than 10 ppm by means of the nitrogen getter.

Preferably, the above-described diamond is such that the ratio of the peak intensity of the free exciton recombination radiation to that of the visible emission in its photoluminescent spectrum at room temperature is larger than 0.1 or such that the full width at half maximum of its Raman scattering peak intrinsic to the diamond is no more than 1.9 cm$^{-1}$. The reason of this condition is to prevent impurities and lattice defects from being included in the crystal, because they (=impurities and lattice defects) create the other emission peaks and at the same time scatter the free exciton, hence reduce its recombination radiation intensity.

Preferably, the above-described diamond is a p-type semiconductor containing boron, and further preferably, the boron content is no more than 40 ppm as measured through the infrared spectroscopy, and furthermore preferably, the boron content is no more than $2 \times 10^{19}$ atoms/cm$^3$ as measured through the SIMS(Secondary Ion Mass Spectroscopy) method. The reason of this condition is that such a range is considered to be a desirable upper limit for the concentration of boron in terms of increasing the conductivity and at the same time suppressing the boron-originated emission intensity.

Preferably, the above-described diamond has a given carbon isotope composition ratio that enables the emission at the above-described given wavelength, for example, the ratio $^{12}$C: $^{13}$C is in the range from 1:99to 99:1. To describe this effect specifically, when the purity of $^{13}$C isotope is 99%, the peak wavelength of the emission can be shifted to a shorter wavelength by approximately 1 nm compared to a case where the purity of $^{13}$C isotope is 1%. Therefore, the above-described diamond has wavelength tunability in accordance with the carbon isotope composition ratio.

Preferably, the above-described diamond is a diamond crystal having the {100} growth sector. The reason of this condition is that the {100} growth sector has lower concentrations of the impurities and lattice defects compared to those grown on other growth sectors and high-quality.

Preferably, the above-described diamond is a diamond crystal such that an electric conductor layer is formed on its surface, and more preferably, such that the aforesaid electric conductor layer is a diamond crystal formed by surface hydrogen-termination treatment. The reason of this condition is that thereby the conductivity of the diamond crystal is improved.

Therefore, in the following description, "high-quality" means to fulfil at least one item of six items below. (1) The impurities and lattice defects are small in number except dopant(s) and there occurs an emission in which the free exciton recombination radiation is dominant. (2) Preferably, the nitrogen content in the diamond crystal is no more than 10 ppm, which is achieved through the fabrication by the high-temperature and high-pressure method with the use of a flux with an impurity getter (for example, a nitrogen getter) added in. (3) Selection of diamonds is performed in consideration of a condition that the ratio of the peak intensity of the free exciton recombination radiation to that of the visible emission in its photoluminescence spectrum at room temperature is larger than 0.1 or a condition that the full width at half maximum of the Raman scattering intrinsic to the diamond is no more than 1.9 cm$^{-1}$. (4) The diamond is a p-type semiconductor containing boron, and preferably, the boron content is no more than 40 ppm as measured through the infrared spectroscopy, and further preferably no more than $2 \times 10^{19}$ atoms/cm$^3$ as measured through the SIMS method. (5) Regarding the growth sector dependence, preferably the diamond is grown on the {100} growth sector. (6) An electric conductor layer is provided on the surface of the diamond crystal as an electric conductive mechanism so that dopant can be dispensed with (for example, the hydrogen-termination treatment of the surface of the diamond crystal).

BRIEF DESCRIPTION OF THE DRAWING

FIG. 5A is its top view and FIG. 5B is its cross-sectional view taken along line VB—VB of FIG. 5A;

DESCRIPTION OF THE PREFERRED EMBODIMENTS

Figure 1A:
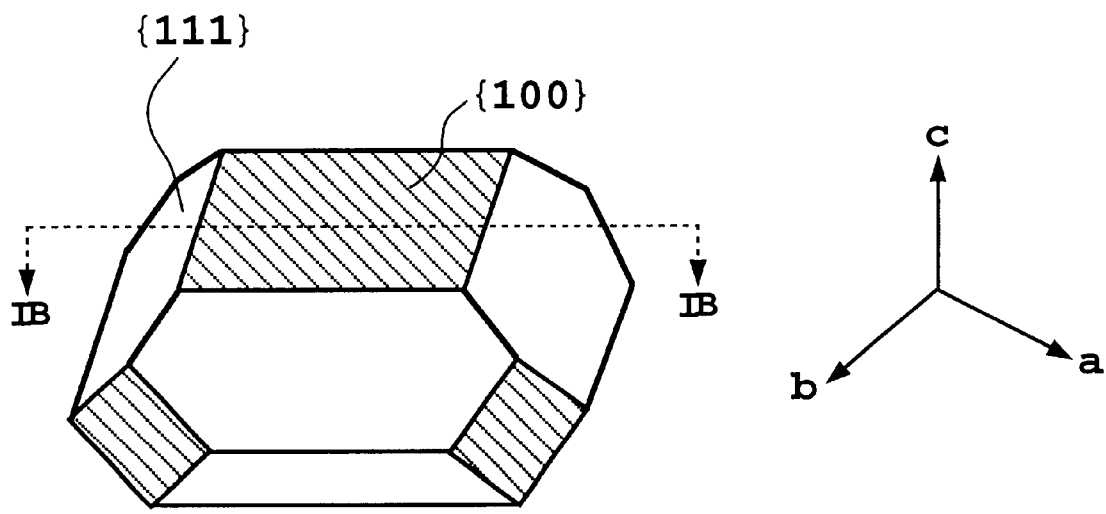
FIG. 1A is a schematic slant view, and FIG. 1B a cross-sectional view taken along line IB—IB of FIG. 1A.

In the first place, high-crystallinity of the diamond crystal that is to be used for the current injection-type diamond ultraviolet light-emitting device according to the present invention will be examined.
(Free Exciton Recombination Radiation)

To begin with, the free exciton recombination radiation that is applied to the current injection-type diamond ultraviolet light-emitting device according to the present invention will be described.

In a perfect semiconductor free of impurities and lattice defects, only an emission based on its conduction band-valence band transition, an emission based on the free exciton recombination, and phonon side bands of both emissions are observed in the vicinity of its band gap through electron beam exciting etc. These are given a generic name, an intrinsic emission of a crystal.

Generally, since the intrinsic emission of a semiconductor crystal has the shortest wavelength among various emissions obtainable with the material and also the density of states of its transition initial state and final state are high, it is a most desirable emission in realizing a practical high-intensity light-emitting device therewith.

However, there could not be a perfect semiconductor free from the impurities and defects, and with increasing concentration of the impurities and defects, the intrinsic emission intensity decreases and emissions originating in the impurities and defects emerge instead.

When a diamond ultraviolet light-emitting device is considered, the emission originated in these impurities and defects is of a longer wavelength and therefore not suitable. For a short wavelength light-emitting device, preferably the material to be used is a material generating intrinsic emission rather than any emissions originating n such impurities and defects.

Further, in order to increase the emission brightness of a device which employs an emission originating in the defects or impurities, higher concentration of defects and/or impurities must be introduced in the crystal. However, this introduction deteriorates the crystal quality, hence reducing the ultraviolet emission intensity. In addition, an emission peak that was induced by the introduction of the impurities and defects has a different wavelength from that of the objective emission. This emission peak dissipates part of an injected energy and therefore lowers the efficiency of a useful ultraviolet emission. Also in this sense, the intrinsic emission is advantageous for the emission mechanism of the diamond ultraviolet light-emitting device.

Since the free exciton recombination radiation and its phonon side bands have sufficient intensities among intrinsic emissions of the diamond and the emission occurs at a short wavelength as described above, an ultraviolet light-emitting device employing this mechanism can be a practical device.

This emission spectrum has been investigated by analytical techniques such as the cathodoluminescence (CL) spectroscopy measured at a low temperature etc. (for example, see: P. J. Dean, E. C. Lightowlers and D. R. Wight, Phys. Rev.,140, p.A352,(1965), etc.).A bandgap (Eg) of the diamond at room temperature is approximately 5.47 eV (wavelength of 227 nm) and the bound energy of a free exciton is approximately 80 meV, and therefore pure free exciton recombination radiation emerges at Eg−Eb=5.39 eV (230 nm). However, a band structure of the diamond is of an indirect transition type, and therefore a group of phonon side bands associated with various phonon creation are mainly observed. Among these emissions, one that has an especially strong intensity and suitable for ultraviolet light-emitting device application is an emission associated with one or more TO (transverse optical) phonon creation, whose emission energy at room temperature resides in the vicinity of 5.28 eV(235 nm), 5.12 eV(242 nm), 4.98 eV(249 nm), and 4.82 eV(257 nm). These plural phonon side bands are overlapped to form a luminescent band, which is observed apparently. Generally, these phonon side bands including all these emissions are called "free exciton recombination radiation." An emission that is suitable ultraviolet light-emitting device is an emission accompanied with one TO phonon, having an energy in the vicinity of 5.28 eV (235 nm) and this emission is referred to as "free exciton recombination radiation" in this description.

However, the free exciton recombination radiation is inhibited from occurring even by the existence of a small mount of crystal defects. Further, the emission intensity decreases rapidly with increasing temperature, and therefore this mechanism has not long been used as a principal emission mechanism for practical ultraviolet light-emitting devices.

In the present invention, found is a fact that, in a high-quality diamond crystal whose concentration of the impurities and defects are sufficiently low, a dominant free exciton recombination radiation can be obtained by the injection of current at room temperature without supplying high energy such as an electron beam and that this fact is successfully employed as an emission mechanism for an ultraviolet light-emitting device.

An impurity and defect that adversely affect free exciton recombination radiation are impurity nitrogen and lattice defect by nitrogen. Nitrogen forms a deep donor level in the diamond crystal and induces other luminescent bands, which absorb the ultraviolet light with a wavelength of 300 nm or less. Further, nitrogen creates a large amount of lattice defects and dislocations in the diamond crystal which deteriorate its crystallinity considerably. Regarding nitrogen in the diamond crystal, its amount can be determined through the infrared absorption spectroscopy and EPR (electron paramagnetic resonance) and its effect on the crystallinity can be evaluated through Raman scattering spectroscopy.

Further, its effect on the emission can be evaluated by photoluminescence.

In the present invention of the diamond current injection-type ultraviolet light-emitting device, it was found that, among impurities, the concentration of nitrogen in the luminescent layer particularly relates to the free exciton recombination radiation.

A lattice defect creates a deep level in a band gap, which generates other emission peak and at the same time scatters free excitons to reduce its recombination radiation intensity. It is difficult to evaluate it quantitatively, but its effect on the emission can be figured out through Raman scattering spectroscopy and photoluminescence.

(Concentration of Nitrogen)

In the present circumstances, a diamond crystal fabricated by the high-temperature and high-pressure method using a flux with a nitrogen getter added in is most suitable for the current injection-type diamond ultraviolet light-emitting device compared to the natural diamond crystals and diamonds in a film or particle shape grown by chemical vapor deposition (CVD) method.

The high-temperature and high-pressure method stated here is the so-called temperature gradient method, a diamond fabrication method where raw material carbon is dissolved in a flux metal in such a temperature-pressure region that the diamond can stably exist and made to precipitate on a seed crystal (a diamond microcrystal). The diamond fabrication method with the use of the temperature gradient method is disclosed in, for example, Japanese Patent Application Laid-open Nos. 4-108532 and 5-200271.

As a metal that is used for the above-described flux (hereinafter referred to as "flux metal"), a material that can dissolve carbon sufficiently and also can function as a catalyst for promoting crystal growth of the diamond is employed. Presenting a concrete description of the flux metal, as described in literatures (for example, Kanda et al., Journal of Chemical Society of Japan, Vol.9, pp.1349–1355 (1981)), the flux metals are specified to be Fe, Co, Ni, these alloys, etc.

The nitrogen getter denotes an element that has higher affinity with nitrogen than the diamond does and can reduce the concentration of nitrogen contained in the diamond crystal than that of the case without the aforesaid nitrogen getter. As described in literatures (for example, H. Sumiya and S. Satoh, Diam. Related Matter., Vol.5, p.1359(1996)), the nitrogen getters are specified as Al, Ti, Zr, etc.

If the diamond crystal is grown by the high-temperature and high-pressure method without adding the nitrogen getter, a grown crystal contains nitrogen far in excess of 10 ppm. On the contrary, if a nitrogen getter is used, nitrogen can be reduced to no more than 10 ppm. When using the diamond fabricated using the nitrogen getter, the current injection-type light-emitting device is constructed, the device exhibits the free exciton recombination radiation with a sufficient intensity. Similar result can also be obtained with the diamond fabricated with the addition of boron.

As for other diamond crystals, one may give the natural crystal, CVD films and particles, and shock-wave crystals. However, the natural crystals are likely to include especially large amount of nitrogen therein and the most part of them contain large amount of the lattice defects. If the current injection-type device is constructed using such a diamond, it is often the case that the free exciton recombination radiation hardly exhibits. Further, CVD films and particles contain a large amount of the impurities and lattice defects in a present situation, so that the crystals do not exhibit the free exciton recombination radiation when the current is injected.

Compared with these crystals, the diamond fabricated by the high-temperature and high-pressure method using the flux with the nitrogen getter added in is excellent in a point that the concentration of impurity other than the dopant and the lattice defect concentration are low and the diamond with the same quality can be manufactured in a high volume.

(Concentration of Boron)

Conventionally, it is known that when the diamond is doped with boron, electric conductivity of a p-type semiconductor can be obtained. Consequently, the concentration of boron contained in the diamond crystal has been examined to provide a current injection-type diamond ultraviolet light-emitting device in which the so-called "boron-originated emission", that is, a mechanism whereby the electric conductivity is excellent and emission intensity is high dominates, by doping boron. In other words, conventionally the impurity-originated emission has been paid with attention, and therefore even the persons skilled in the art never thought of a standpoint of determining the amount of dopant for controlling the conductivity of the crystal that dose not hinder the free exciton recombination emission.

Contrary to the conventional idea, in the present invention, a desirable upper limit of the concentration of boron for improving the electric conductivity was investigated in a point of view that the boron-originated emission intensity is suppressed to a permissible low level with the intention of providing a current injection-type diamond ultraviolet light-emitting device in which an emission mechanism by the so-called "free exciton radiation" is dominant. As a result of the investigation, the present inventors obtained a finding that, although boron is a dopant which is doped intentionally to control the conductivity of the diamond, boron does not hinder the free exciton emission even when boron was doped to a relatively high concentration.

By the way, in the present description, the concentration of boron is an effective acceptor concentration determined by a quantitative method with the use of the infrared absorption spectroscopy at room temperature (R. M. Cherenko, H. M. Strong and R. E. Tuft, Phil. Mag., Vol.23, p.313(1971)) except otherwise specified. Further, when the total concentration of boron in the crystal was measured, the SIMS was used. By using this SIMS method, the total concentration of boron including boron that is inactive as the acceptor can be measured. Boron in the diamond creates an acceptor level approximately 350 meV above from the valence band and some of the boron atoms are activated at room temperature and function as acceptors. Therefore, the effective acceptor concentration of boron becomes smaller than the total concentration of boron.

(Evaluation Method of the Diamond Crystal)

Evaluation of the diamond crystal suitable for the free exciton recombination light-emitting device can be performed by using the photoluminescence spectroscopy and Raman scattering spectroscopy.

(1) Evaluation by the Photoluminescence Spectroscopy

The photoluminescence spectroscopy is an evaluation method of crystals where by irradiating a semiconductor crystal with light having an energy larger than the bandgap of the semiconductor, free carriers are generated in the crystal and radiation in their relaxation process is measured. Through investigation of its emission spectrum, information concerning the type of impurities and lattice defects, and their concentration in the semiconductor crystal as a bulk can be obtained with high sensitivity and in a nondestructive and noncontact manner.

In the high-quality diamond where the free exciton recombination radiation is sufficiently intense, the conventional methods, for example an electron beam excited cathodoluminescence etc., cannot observe visible emission (namely, emission covering a broad range of wavelengths in the visible region) that may originate in the crystal lattice defects. In this sense, the evaluation by photoluminescence is quite useful for the diamond light-emitting devices such that the free exciton recombination radiation is its main emission mechanism.

(2) Evaluation Through Raman Scattering Spectroscopy

First, Raman scattering will be described. A phenomenon that a photon radiated into a sample interacts with a phonon in the crystal and a photon whose energy is shifted by the energy of this phonon is radiated is called Raman scattering. Raman scattering spectroscopy is a sample evaluation method where by analyzing spectrum of the radiated light (scattering light), information concerning lattice defects, stress, impurities is obtained.

In the diamond crystal, an intrinsic Raman scattering peak emerges at 1332 cm$^{-1}$ to 1333 cm$^{-1}$. The full width at half maximum of the peak is sensitive especially to the lattice defect concentration and the nitrogen concentration and useful to evaluate the crystal to be used for the ultraviolet light-emitting device which employs the recombination radiation of free excitons excited by the injection of current as a main emission mechanism. This Raman scattering spectroscopy can be used for the selection of the diamond crystals that are to be used as the ultraviolet light-emitting device to construct the current injection-type diamond ultraviolet light-emitting device.

(Carbon Isotope Effect)

By altering the isotope composition ratio, wavelength tuning of the free exciton recombination radiation can be achieved. For example, in the current injection-type diamond ultraviolet light-emitting device with the use of the diamond in which $^{13}$C concentration is increased up to 99% apart from the normal diamond having natural isotopic ratio, the emission wavelength can be shortened by approximately 1 nm and thus shorter wavelength light-emitting device can be realized.

(Examination of the Growth Sectors)

Figure 1B:
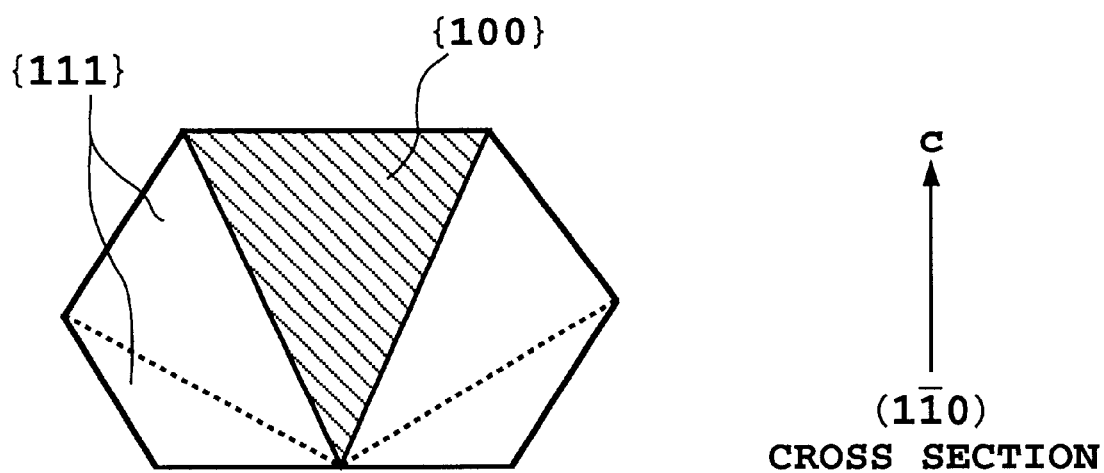
FIG. 1 is a diagram for illustrating the {111} growth sector and the {100} growth sector which are to be applied for the current injection-type diamond light-emitting device according to the present invention.

A typical cross-sectional distribution of the growth sectors of the diamond crystal fabricated by the high-temperature and high-pressure synthetic method is shown in FIG. 1B. As shown in this figure, the {100} growth sector and the {111} growth sector exist from the vicinity of a center of the under surface of the crystal to respective planes radially, respectively. It is known that, since the {100} growth sector has lower concentration of impurities and lattice defects than other growth sectors and provides a high-quality diamond, the {100} growth sector is advantageous than the {111} growth sector. In the light of this fact, it is preferable to adopt the diamond crystal having the {100} growth sector for the current injection-type diamond ultraviolet light-emitting device according to the present invention. However, the present invention is not limited within the diamond having the {100} growth sector.

(Surface Conductor Layer)

A conductor layer can be provided on the surface of the diamond crystal as an electric conductive mechanism. For example, it is known that there exists an electric conductor layer having relatively high conductivity in the vicinity of the surface of a diamond thin film synthesized by the CVD method after hydrogen-termination. This conductor layer emerges after the diamond crystal is exposed to hydrogen plasma and exhibits p-type conduction. Further, electrical and optical characteristics of the diamond thin film after being hydrogen-terminated were evaluated by, for example, CL spectroscopy (Hayashi et al., NEW DIAMOND, Vol.13, No. 3, pp.7–13(1997)). However, a current injection-type diamond ultraviolet light-emitting device has not been reported so far that uses a surface conductor layer which is obtained by performing hydrogen-terminated on a diamond crystal surface that has not been doped with a dopant intentionally nor includes impurities. The inventors of the present invention have obtained a finding that, since such a current injection-type diamond ultraviolet light-emitting device employs free exciton emission intrinsic to the diamond (that is, not dependent on the impurities nor lattice defects) as an emission mechanism, a surface hydrogen-terminated conductor layer can be used as a conduction mechanism even in the case of a non-doped high-pressure crystal. Such a conduction mechanism is most advantageous in terms of the internal efficiency of the free exciton radiation (a ratio of the radiation energy to an energy amount injected into the crystal) because the crystal is not doped with a dopant (boron).

In the following, concrete embodiments of the current injection-type diamond ultraviolet light-emitting device according to the present invention will be described.

<Embodiment 1>

Figure 2:
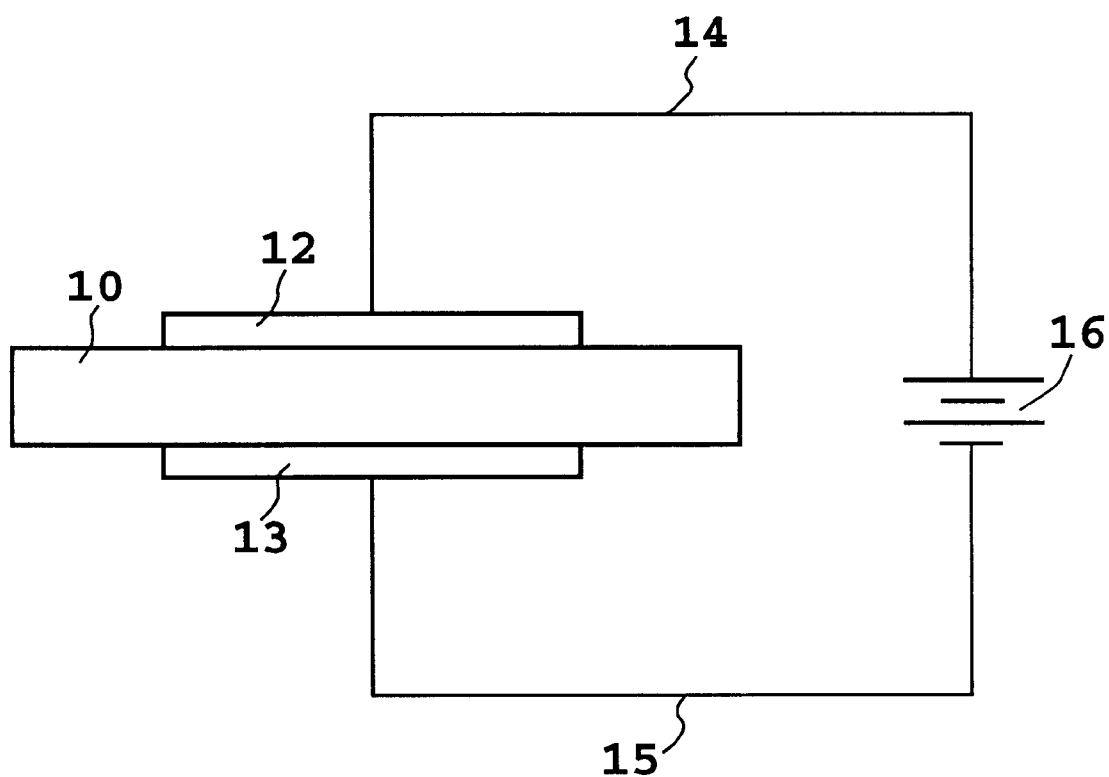
FIG. 2 is a schematic diagram showing the configuration of an embodiment according to the present invention of the current injection-type diamond light-emitting device.

A configuration of the current injection-type diamond ultraviolet light-emitting device according to the present invention is shown in FIG. 2.

In this figure, the current injection-type diamond ultraviolet light-emitting device is constructed with a diamond crystal 10 of a p-type semiconductor doped with boron, and an electrode 12 and an electrode 13 which sandwich the aforesaid diamond crystal 10. Further, these electrode 12 and 13 are made of Ag and connected to the external power supply 16 via wiring 14 and 15. In this figure, current injection-type diamond ultraviolet light-emitting device is configured in such a way that electrons are injected from the electrode 13 into the diamond crystal 10 and holes and free excitons are created in the diamond crystal 10. Further, since this diamond crystal 10 is of high-quality as will be described later, the concentrations of lattice defects and impurities are low and hence free excitons can combine with each other, as it is, and the free exciton recombination radiation can be achieved.

The current injection-type diamond ultraviolet light-emitting device comprising such a configuration was fabricated in the following procedures.

First, a nitrogen getter (Al, Ti, and Zr) is added to a flux (Fe—Co alloy) and a diamond crystal was fabricated by the high-temperature and high-pressure method using this flux. The growth temperature was approximately 1450° C., the pressure approximately 6.3 GPa, growth time 48.9 hours, respectively. A seed crystal was arranged in such a way that a growth direction coincides with [001]. In order to give electric conductivity to the crystal itself and convert it into a p-type semiconductor, boron of approximately 1000 ppm was added to the raw material carbon. As a result of synthesis, a light blue colored single crystal having {100} and {111} facets with an weight of 47.7 mg was obtained.

This crystal was polished into a plate shape with dimensions of 3 mm×2 mm×0.3 mm.

This crystal was measured through the infrared absorption spectroscopy and the effective acceptor concentration in the crystal was found to be 4 ppm. Further, the concentration of nitrogen in the crystal was also determined, similarly through the infrared absorption spectroscopy, to be 0.1 ppm.

On this crystal, photoluminescence spectrum was measured using the fifth harmonics (wavelength of 213 nm) of a Nd: YAG laser as exciting light. In the spectrum, only the recombination radiation of the free excitons and the bound excitons and their phonon side bands in the ultraviolet light region as well as a broad emission in the visible region were observed. A peak intensity ratio of the free exciton recombination radiation to the visible emission at room temperature was approximately 0.2, higher than 0.1.

Raman spectrum was measured on this crystal through excitation by Ar$^+$ laser (wavelength of approximately 514.3 nm). In the spectrum, only a scattering peak intrinsic to the diamond was observed at a position of a Raman shift, 1333 cm$^{-1}$. Considering the resolution of the equipment etc., the true full width at half maximum was 1.7 cm$^{-1}$, which was smaller than 1.9 cm$^{-1}$.

A current injection-type diamond ultraviolet emitting device having a structure as shown in FIG. 2 was fabricated that has a luminescent layer comprising a diamond crystal whose top plane was chosen to be the {100} growth sector by using the above-described diamond crystal and also forming the electrodes with Ag.

Figure 3:
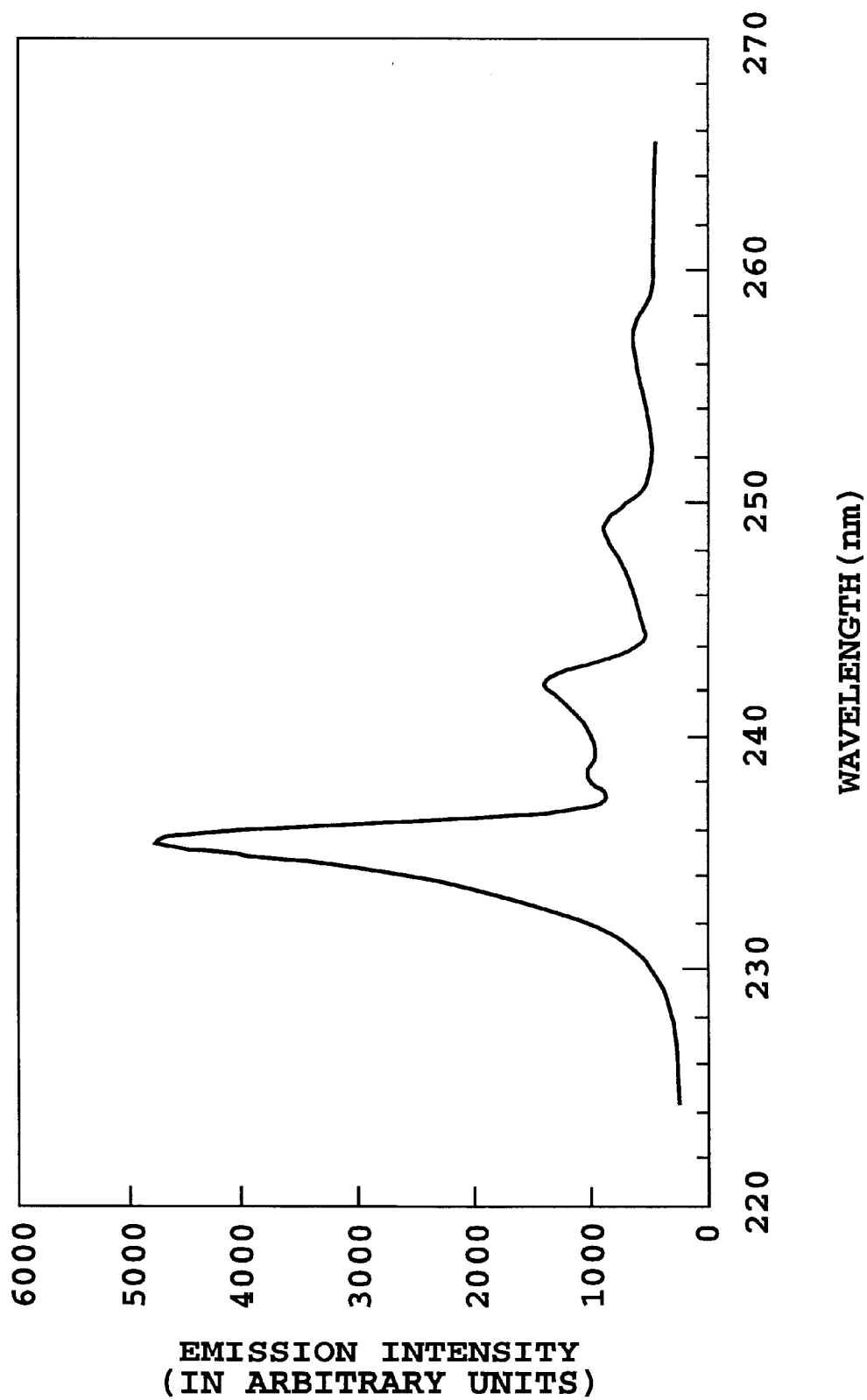
FIG. 3 is a graph showing the emission spectrum of one example of the current injection-type diamond light-emitting device according to the present invention.

A DC voltage was applied between both electrodes at room temperature and current was injected. As a results, at the amount of current of around 20 mA or so, an ultraviolet emission from the device started to be observed. An emission spectrum at a current of 80 mA is shown in FIG. 3. As can be seen from this figure, in the device of the present embodiment, the boron-originated emission peak at the 238 nm wavelength was observed, but its emission remain as a side phenomenon. The 235 nm wavelength peak originating in the free exciton recombination radiation is a dominant emission and the ratio of the latter to the former was found to be twice or more. Besides, the emission intensity is sufficiently large.

Figure 4:
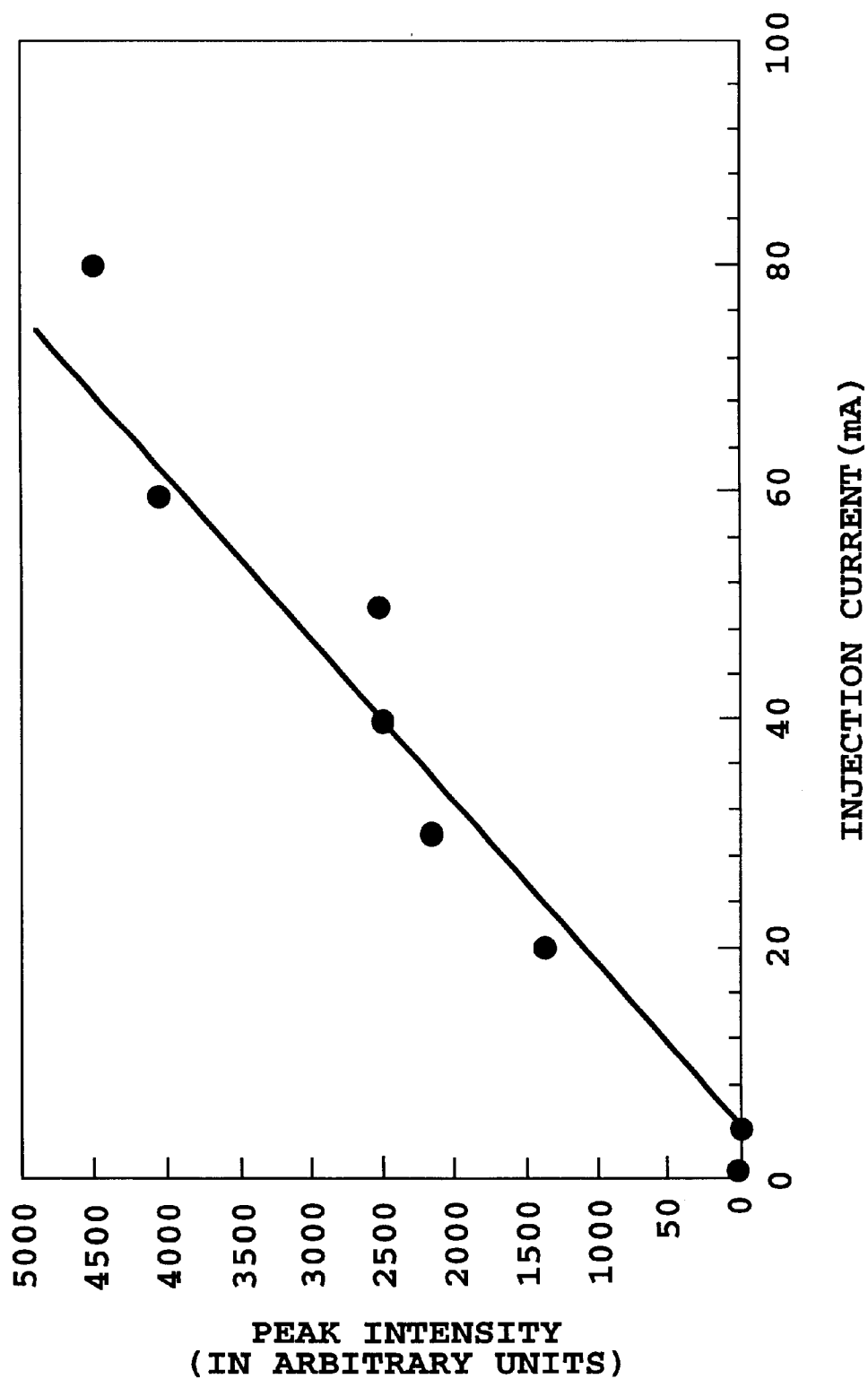
FIG. 4 is a graph showing the relationship between the emission peak intensity and the amount of current in one example of the current injection-type diamond light-emitting device according to the present invention.

FIG. 4 shows the dependency of the free exciton emission intensity on the amount of current of this embodiment. As shown in FIG. 4, free exciton emission intensity increases proportionally to the amount of current, and therefore it was confirmed that the free exciton recombination radiation was generated by the injection of current.

<Embodiment 2–6>

In fabricating the current injection-type diamond ultraviolet light-emitting device in a generally similar manner as that of Embodiment 1, the concentration of boron of the diamond crystal is chosen to be either of 0.4, 1.40, 8.90, 16.0 and 37.8 ppm and each embodiment having the concentration of boron in the above order is referred to as Embodiments 2, 3, 4, 5, and 6, respectively.

<Embodiment 7>

Figure 5A:
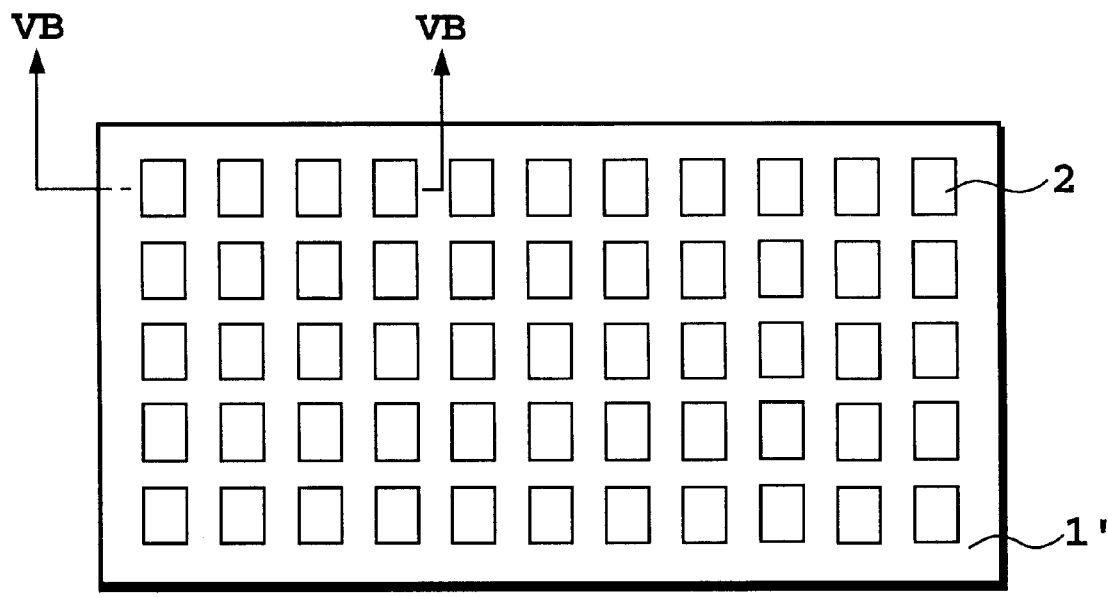
FIGS. 5A and 5B are diagrams showing another example of the current injection-type diamond light-emitting devices according to the present invention.
Figure 5B:
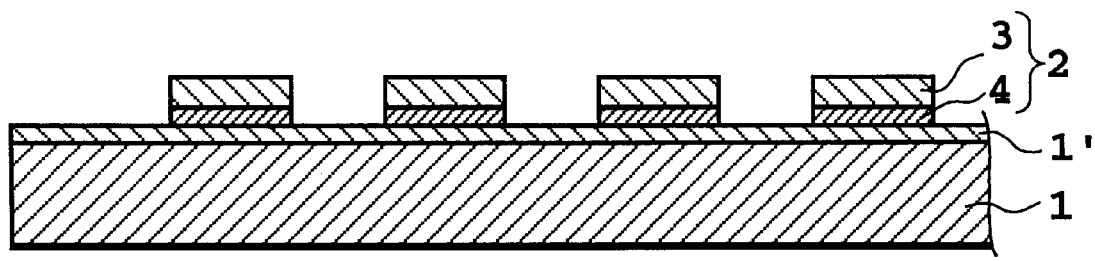

FIG. 5A is a top view showing a schematic configuration of the current injection-type diamond light-emitting device according to the present invention. Further, FIG. 5B is a cross-sectional view taken along line VB—VB in FIG. 5A. In the figure, numeral 1 denotes a diamond crystal, 1' a hydrogen-terminated surface conductor layer, 2 an electrode, 3 a Cr electrode, and 4 a Au electrode.

The diamond crystal to be used for the current injection-type diamond light-emitting device of this embodiment is fabricated by the high-temperature and high-pressure method, without doping boron and in the presence of the nitrogen getter. Further, the concentration of nitrogen of the diamond crystal was 0.1 ppm and the carbon isotope concentration ratio was $^{12}$C: $^{13}$C=99:1. To the diamond crystals thus obtained, the hydrogen-termination treatment was performed by microwave plasma CVD equipment with conditions: a total pressure of 40 torr, a microwave output of 600W, a hydrogen flow rate of 500 ccm, a substrate temperature of 900° C., a treatment time of 10 minutes, and a cooling time of 30 minutes. Subsequently, Au/Cr electrodes having a dimension of 100 μm square are formed on a diamond crystal surface by photolithography, with a pitch of 200 μm <Embodiment 8>

Setting the dosage of the nitrogen getter down to one fifth of that of Embodiment 7 while other conditions than this were kept unchanged as specified in Embodiment 7, the current injection-type diamond ultraviolet light-emitting device having a 1 ppm concentration of nitrogen was fabricated.

<Embodiment 9>

Setting the dosage of the nitrogen getter to be one fiftieth of that of Embodiments 7 while other conditions than this were kept unchanged as specified in Embodiment 7, the current injection-type diamond ultraviolet light-emitting device having a 10 ppm concentration of nitrogen was fabricated.

<Embodiment 10>

Setting the isotope composition ratio of the diamond crystal to be $^{12}C: ^{13}C=1:1$ while other conditions than this were kept unchanged as specified in Embodiment 1, the current injection-type diamond ultraviolet light-emitting device was fabricated.

<Embodiment 11>

Setting the isotope composition ratio of the diamond crystal to be $^{12}C: ^{13}C=1:99$ while other conditions than this were kept unchanged as specified in Embodiment 1, the current injection-type diamond ultraviolet light-emitting device was fabricated.

<Embodiment 12>

In the above-described Embodiment 1 through Embodiment 11, the {100} growth sector of the diamond was used. However, in this embodiment, the current injection-type diamond ultraviolet light-emitting device with the use of the {111} sector was fabricated.

<Embodiment 13>

When fabricating the current injection-type diamond ultraviolet light-emitting device in the same manner as that of Embodiment 1, the concentration of boron of the diamond crystal was set to be $1.5\times10^{19}$ atoms/cm$^3$ as measured by the SIMS method.

COMPARATIVE EXAMPLE 1

In this comparative example, the diamond was synthesized without adding the nitrogen getter so as to have a 40 ppm concentration of nitrogen while other conditions than this were kept unchanged as specified in Embodiment 1.

COMPARATIVE EXAMPLE 2

In this comparative example, using a non-colored natural diamond crystal in stead of the synthetic diamond crystal which were used for Embodiment 1, the current injection-type light-emitting device comprising a diamond crystal having a 1,200 ppm concentration of nitrogen was fabricated.

COMPARATIVE EXAMPLE 3

In this comparative example, the concentration of boron of the diamond crystal was set to be 47.3 ppm while other conditions than this were kept unchanged as specified in Embodiment 1, and the current injection-type diamond light-emitting device was fabricated.

COMPARATIVE EXAMPLES 4 and 5

In these comparative examples, the concentration of boron was set to be $2.5\times10^{19}$ atoms/cm$^3$ and $7.0\times10^{19}$ atoms/cm$^3$ as measured by the SIMS method, respectively, while other conditions than this were kept unchanged as specified in Embodiment 1, and the current injection-type diamond light-emitting device was fabricated.

Using the current injection-type diamond light-emitting devices fabricated in the above-described manner (Embodiment 1 through Embodiment 13 and the comparative examples 1 through 5) as samples, high-quality properties of the diamond crystals were examined.

(1) Examination of the Concentration of Nitrogen

The relationship between the concentration of nitrogen and the free exciton recombination radiation by the injection of current is shown in Table 1.

TABLE 1

| Sample | Concentration of nitrogen in diamond crystal (ppm) | Existence/non-existence of free exciton recombination radiation in current injection |
|---|---|---|
| Embodiment 7 | 0.1 | Existence |
| Embodiment 8 | 1.0 | Existence |
| Embodiment 9 | 10.0 | Existence |
| Comparative example 1 | 40 | Non-existence |
| Comparative example 2 | 1,200 | Non-existence |

As is evident from the above-indicated Table 1, when the concentration of nitrogen in the diamond crystal becomes no less than 40 ppm, the free exciton recombination radiation was not substantially observable when the current was injected.

(2) Examination on the Evaluation Method of the Diamond Crystal by Photoluminescence Using diamond crystals manufactured by the high-temperature and high-pressure method using the nitrogen getter (Embodiments 1, 2, and 7) and natural diamond crystals (the comparative example 2), the relationship between the ratio of the ultraviolet emission intensity to the visible emission intensity in the photoluminescence spectrum and the free exciton recombination radiation by the injection of current was examined. Photoluminescence spectrum of each sample was measured at room temperature using the fifth harmonics of a Nd:YAG laser (wavelength of 213 nm) as exciting light. The results are shown in Table 2.

TABLE 2

| Sample | Ratio of peak intensities of free exciton recombination radiation to visible region emission in photoluminescence | Existence/non-existence of free exciton recombination radiation in current injection |
|---|---|---|
| Embodiment 7 | 200 | Existence |
| Embodiment 1 | 0.2 | Existence |
| Embodiment 2 | 18 | Existence |
| Comparative example 2 | 0.05 | Non-existence |

As can be understood from the above-indicated Table 2, with crystals whose ratio of the ultraviolet emission intensity to the visible emission intensity was no less than around 0.1 or so in the photoluminescence spectroscopy analysis, emission by the free exciton recombination was observed when the current was injected. On the other hand, with crystals whose ratio of the ultraviolet emission intensity to the visible emission intensity was less than around 0.1 or so in the photoluminescence analysis, emission by the free exciton recombination was not observed when the current was injected.

(3) Examination on Evaluation Method of the Diamond Crystal Through Raman Scattering Spectroscopy Using diamond crystals fabricated by the high-temperature and high-pressure method with the use of the nitrogen getter (Embodiments 1 and 7, the comparative examples 1 and 2), the relationship of the full width at half maximum of the Raman scattering peak intrinsic to the diamond and the free exciton recombination radiation by the injection of current was investigated through the Raman spectrum measurement of each sample excited by $Ar^+$ laser (wavelength of approximately 514.5 nm). The resolution of an apparatus used for this measurement was set to have a sufficiently high resolution so as not to affect the shape of the Raman scattering peak intrinsic to the diamond.

TABLE 3

| Sample | FWHM of scattering peak intrinsic to diamond in Raman scattering spectroscopy ($cm^{-1}$) | Existence/non-existence of free exciton recombination radiation in current injection |
| --- | --- | --- |
| Embodiment 7 | 1.5 | Existence |
| Embodiment 1 | 1.7 | Existence |
| Comparative example 2 | 2.3 | Non-existence |
| Comparative example 1 | 2.0 | Non-existence |

As can be understood from the Table 3, using the diamond crystal whose full width at half maximum of the intrinsic peak in Raman scattering spectroscopy is no more than 1.9 $cm^{-1}$, the current injection-type light-emitting device that has a sufficient free exciton recombination radiation intensity was able to be fabricated. However, in the current injection-type light-emitting device which was fabricated using a crystal having the full width at half maximum no less than approximately 2.0 $cm^{-1}$, sufficient emission by the free exciton recombination was not observed.

(4) Examination of the Concentration of Boron Through the Infrared Spectroscopy

On the current injection-type diamond ultraviolet light-emitting devices of Embodiments 1 to 6 and the comparative example 3, the amount of boron was determined based on the intensities of absorption peaks at 1,280 $cm^{-1}$ and 2,800 $cm^{-1}$ caused by boron in the diamond crystal using a microscopic Fourier transform infrared spectrophotometer (Janssen Micro FTIR Spectrometer, JASCO Corporation). This method determined the amount of boron that contributes to the electrical conductivity in the diamond (effective acceptor concentration). The concentrations of boron in a table indicated below presents these measured values, not indicating the dosage of boron to a raw material carbon source.

TABLE 4

| Sample | Concentration of boron (ppm) | Existence/non-existence of free exciton recombination radiation in current injection |
| --- | --- | --- |
| Embodiment 1 | 4.0 | Existence |
| Embodiment 2 | 0.4 | Existence |
| Embodiment 3 | 1.40 | Existence |
| Embodiment 4 | 8.90 | Existence |
| Embodiment 5 | 16.0 | Existence |
| Embodiment 6 | 37.8 | Existence |
| Comparative example 3 | 47.3 | Non-existence |

As is evident from the above-indicated table 4, an upper limit of the boron content that enables the free exciton recombination radiation by the injection of current is considered to be approximately 40 ppm. Therefore, to determine the upper limit of the concentration of boron more accurately, with respect to a boundary concentration region between Embodiment 6 and the comparative example 3, the concentration of boron was measured through the SIMS method as Embodiment 13, a comparative example 4, and a comparative example 5. The results are shown in Table 5.

TABLE 5

| Sample | Concentration of boron measured by SIMS method ($atoms/cm^3$) | Existence/non-existence of free exciton recombination radiation in current injection |
| --- | --- | --- |
| Embodiment 13 | $1.5 \times 10^{19}$ | Existence |
| Comparative example 4 | $2.5 \times 10^{19}$ | Non-existence |
| Comparative example 5 | $7.0 \times 10^{19}$ | Non-existence |

As is evident from these results, the upper limit of the total boron content that enables the free exciton recombination radiation by the injection of current is $2 \times 10^{19}$ $atoms/cm^3$.

(5) Examination of the Carbon Isotope Composition Ratio

Figure 6:
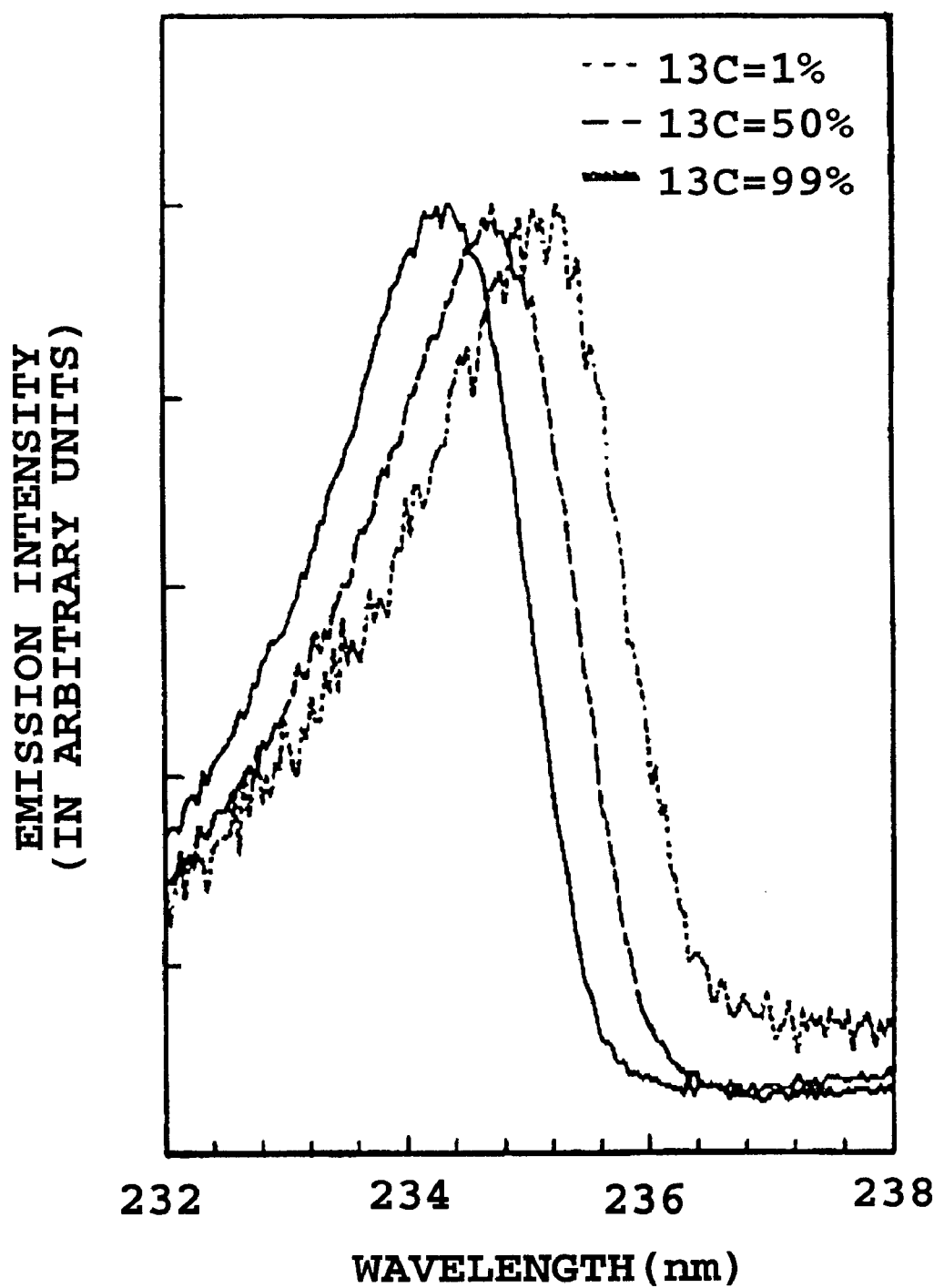
FIG. 6 is a spectrum diagram for describing wavelength displacement resulted from the alteration of isotope composition ratio in the current injection-type diamond light-emitting device according to the present invention.

Wavelengths of a main peak of the free exciton recombination radiation that arises from excitation by the injection of current to the current injection-type diamond ultraviolet light-emitting device of Embodiments 7, 10, and 11 were obtained. The results are shown in FIG. 6 and Table 6 below.

TABLE 6

| Sample | Isotope composition ratio | Main peak position of free exciton recombination radiation (nm) |
| --- | --- | --- |
| Embodiment 7 | Natural abundance ratio ($^{12}C99\%$, $^{13}C1\%$) | 235.1 |
| Embodiment 10 | $^{12}C:^{13}C = 1:1$ ($^{12}C50\%$, $^{13}C50\%$) | 234.8 |
| Embodiment 11 | $^{13}C$ ($^{12}C1\%$, $^{13}C99\%$) | 234.4 |

As can be seen evidently from this table 6, the emission wavelength can be controlled within a wavelength width of around 1 nm or so by altering the isotope composition ratio of the diamond.

(6) Examination of the Growth Sectors

The {100} growth sector of a high-pressure synthetic crystal is known to have low concentrations of impurities and lattice defects compared to those of other sectors and hence be of high-quality, so that that sector is advantageous in terms of the free exciton emission intensity.

Therefore, the relationship between the growth sector and a current injection emission spectrum in the diamond crystal of the current injection-type diamond ultraviolet light-emitting device of Embodiment 7 and Embodiment 12 was investigated. From the results, it was recognized that both growth sectors exhibited free exciton recombination emission at the 235 nm wavelength. For this case, the ratio of the free exciton recombination emission intensity to the visible emission intensity of the {100} growth sector is approximately 50 times higher than that of the {111} growth sector. In the current injection-type diamond ultraviolet light-emitting device, the visible emission is a main cause to dissipate part of injected energy and reduce an overall luminous efficiency. Therefore, the high-quality {100} growth sector is suitable for a device that employs the free exciton emission for its emission mechanism.

(7) Examination of the Surface Electric Conductor Layer

Figure 7:
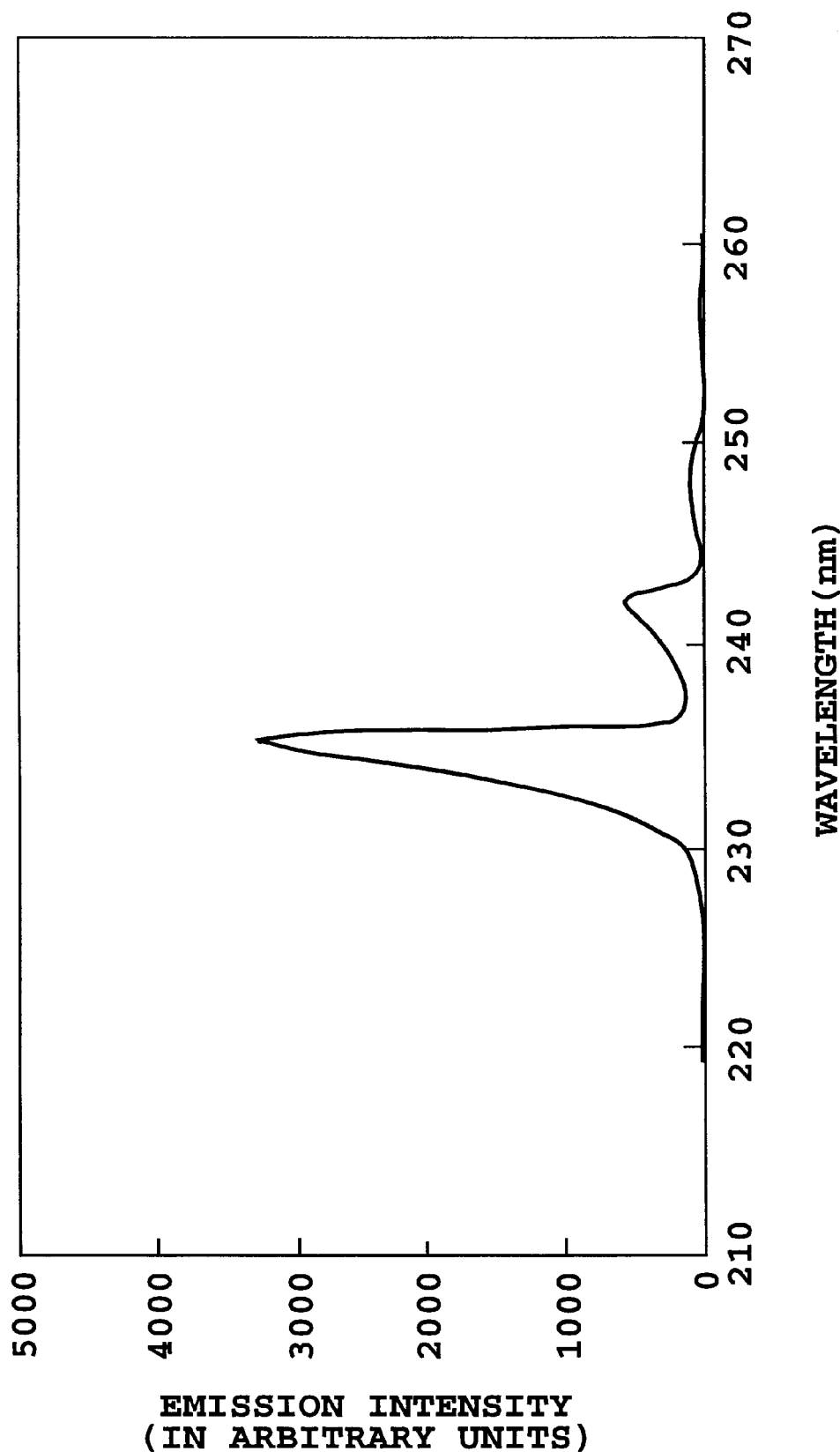
FIG. 7 is a graph showing the current injection emission spectrum observed in one example of the current injection-type diamond light-emitting device according to the present invention with the use of the diamond crystal having a hydrogen-terminated surface conductor layer.

FIG. 7 is a graph showing an emission spectrum when the current injection-type diamond ultraviolet light-emitting device of Embodiment 7 is applied with a DC voltage of 220 V between its adjacent electrodes. As can be seen from this figure, a distinct free exciton emission peak can be recognized at a wavelength of 235 nm. Further, as is evident when comparing the emission spectrum of FIG. 7 with the emission spectrum of FIG. 3, no peaks originating in the impurities, such as the 238 nm wavelength peak etc., exist in the ultraviolet wavelength region.

INDUSTRIAL APPLICABILITY

As described in the foregoing, the current injection-type diamond ultraviolet light-emitting device according to the present invention is capable of operating at room temperature and achieving the free exciton recombination radiation due to excitation by the injection of current. Further, compared to conventional ultraviolet light-emitting devices with the use of luminescent bands that originate in the impurities and/or defects, the current injection-type diamond ultraviolet light-emitting device is easy to be fabricated to achieve high brightness and higher efficiency and provide ultraviolet light of a shorter wavelength.

What is claimed and desired to be secured by United States Letters Patent is:

1. An ultraviolet light-emitting device comprising:
   (a) an electrode; and
   (b) a diamond crystal having impurities and being coupled with the electrode, the diamond crystal being configured such that when electric current is injected into the diamond crystal from the electrode, the diamond crystal emits free excitation recombination radiation in the ultraviolet region of wavelengths at a first intensity and the impurities within the diamond crystal emit a radiation in the ultraviolet region of wavelengths at a second intensity, the first intensity being at least twice as large as the second intensity.

2. An ultraviolet light-emitting device according to claim 1, wherein the first intensity is at least twice as large as the second intensity in the ultraviolet region of wavelengths no more than 300 nm.

3. An ultraviolet light-emitting device according to claim 2 wherein the diamond crystal is fabricated by a high-temperature and high-pressure method using a flux with an impurity getter added therein.

4. An ultraviolet light-emitting device according to claim 2, wherein the diamond crystal has a concentration of nitrogen that is no more than 10 ppm.

5. An ultraviolet light-emitting device according to claim 2, wherein the diamond crystal has a ratio of a peak intensity of the free excitation recombination radiation to that of a visible emission in its photoluminescence spectrum at room temperature which is more than 0.1.

6. An ultraviolet light-emitting device according to claim 2, wherein the diamond crystal has a full width at half maximum of the Raman scattering peak intrinsic to the diamond crystal that is no more than 1.9 cm$^{-1}$.

7. An ultraviolet light-emitting device according to claim 2, wherein the diamond layer has a carbon isotope composition ratio.

8. An ultraviolet light-emitting device according to claim 2, wherein the diamond crystal has a {100} growth sector.

9. An ultraviolet light-emitting device according to claim 2, further comprising an electric conductor layer form on the diamond crystal.

10. An ultraviolet light-emitting device according to claim 2, wherein the diamond crystal is a p-type semiconductor containing boron.

11. An ultraviolet light-emitting device according to claim 1, wherein the diamond crystal is fabricated by a high-temperature and high-pressure method using a flux with an impurity getter added therein.

12. An ultraviolet light-emitting device according to claim 11, wherein the diamond crystal has a concentration of nitrogen that is no more than 10 ppm.

13. An ultraviolet light-emitting device according to claim 11, wherein the diamond crystal has a ratio of a peak intensity of the free excitation recombination radiation to that of a visible emission in its photoluminescence spectrum at room temperature which is more than 0.1.

14. An ultraviolet light-emitting device according to claim 11, wherein the diamond crystal has a full width at half maximum of the Raman scattering peak intrinsic to the diamond crystal that is no more than 1.9 cm$^{-1}$.

15. An ultraviolet light-emitting device according to claim 11, wherein the diamond layer has a carbon isotope composition ratio.

16. An ultraviolet light-emitting device according to claim 11, wherein the diamond crystal has a {100} growth sector.

17. An ultraviolet light-emitting device according to claim 11, further comprising an electric conductor layer form on the diamond crystal.

18. An ultraviolet light-emitting device according to claim 11, wherein the diamond crystal is a p-type semiconductor containing boron.

19. An ultraviolet light-emitting device according to claim 11, wherein the impurity getter is a nitrogen getter.

20. An ultraviolet light-emitting device according to claim 19, wherein the diamond crystal has a concentration of nitrogen that is no more than 10 ppm.

21. An ultraviolet light-emitting device according to claim 19, wherein the diamond crystal has a ratio of a peak intensity of the free excitation recombination radiation to that of a visible emission in its photoluminescence spectrum at room temperature which is more than 0.1.

22. An ultraviolet light-emitting device according to claim 19, wherein the diamond crystal has a full width at half maximum of the Raman scattering peak intrinsic to the diamond crystal that is no more than 1.9 cm$^{-1}$.

23. An ultraviolet light-emitting device according to claim 19, wherein the diamond crystal has a carbon isotope composition ratio.

24. An ultraviolet light-emitting device according to claim 19, wherein the diamond crystal has a {100} growth sector.

25. An ultraviolet light-emitting device according to claim 19, further comprising an electric conductor layer form on the diamond crystal.

26. An ultraviolet light-emitting device according to claim 19, wherein the diamond crystal is a p-type semiconductor containing boron.

27. An ultraviolet light-emitting device according to claim 1, wherein the diamond crystal has a concentration of nitrogen that is no more than 10 ppm.

28. An ultraviolet light-emitting device according to claim 27, wherein the diamond crystal has a ratio of a peak intensity of the free excitation recombination radiation to that of a visible emission in its photoluminescence spectrum at room temperature which is more than 0.1.

29. An ultraviolet light-emitting device according to claim 27, wherein the diamond crystal has a full width at half maximum of the Raman scattering peak intrinsic to the diamond crystal that is no more than 1.9 cm$^{-1}$.

30. An ultraviolet light-emitting device according to claim 27, wherein the diamond crystal has a carbon isotope composition ratio.

31. An ultraviolet light-emitting device according to claim 27, wherein the diamond crystal has a {100} growth sector.

32. An ultraviolet light-emitting device according to claim 27, further comprising an electric conductor layer form on the diamond crystal.

33. An ultraviolet light-emitting device according to claim 27, wherein the diamond crystal is a p-type semiconductor containing boron.

34. An ultraviolet light-emitting device according to claim 1, wherein the diamond crystal has a ratio of a peak intensity of the free excitation recombination radiation to that of a visible emission in its photoluminescence spectrum at room temperature which is more than 0.1.

35. An ultraviolet light-emitting device according to claim 34, wherein the diamond crystal has a carbon isotope composition ratio.

36. An ultraviolet light-emitting device according to claim 34, wherein the diamond crystal has a {100} growth sector.

37. An ultraviolet light-emitting device according to claim 34, further comprising an electric conductor layer form on the diamond crystal.

38. An ultraviolet light-emitting device according to claim 34, wherein the diamond crystal is a p-type semiconductor containing boron.

39. An ultraviolet light-emitting device according to claim 1, wherein the diamond crystal has a full width at half maximum of the Raman scattering peak intrinsic to the diamond crystal that is no more than 1.9 cm$^{-1}$.

40. An ultraviolet light-emitting device according to claim 39, wherein the diamond crystal has a carbon isotope composition ratio.

41. An ultraviolet light-emitting device according to claim 39, wherein the diamond crystal has a {100} growth sector.

42. An ultraviolet light-emitting device according to claim 39, further comprising an electric conductor layer form on the diamond crystal.

43. An ultraviolet light-emitting device according to claim 39, wherein the diamond crystal is a p-type semiconductor containing boron.

44. An ultraviolet light-emitting device according to claim 1, wherein the diamond crystal has a carbon isotope composition ratio.

45. An ultraviolet light-emitting device according to claim 44, wherein the diamond crystal has a {100} growth sector.

46. An ultraviolet light-emitting device according to claim 44, further comprising an electric conductor layer form on the diamond crystal.

47. An ultraviolet light-emitting device according to claim 44, wherein the diamond crystal is a p-type semiconductor containing boron.

48. An ultraviolet light-emitting device according to claim 44, wherein the carbon isotope composition ratio comprises $^{12}C$: $^{13}C$ in a range of 1:99 to 99:1.

49. An ultraviolet light-emitting device according to claim 48, wherein the diamond crystal has a {100} growth sector.

50. An ultraviolet light-emitting device according to claim 48, further comprising an electric conductor layer form on the diamond crystal.

51. An ultraviolet light-emitting device according to claim 48, wherein the diamond crystal is a p-type semiconductor containing boron.

52. An ultraviolet light-emitting device according to claim 1, wherein the diamond crystal has a {100} growth sector.

53. An ultraviolet light-emitting device according to claim 52, further comprising an electric conductor layer form on the diamond crystal.

54. An ultraviolet light-emitting device according to claim 52, wherein the diamond crystal is a p-type semiconductor containing boron.

55. An ultraviolet light-emitting device according to claim 1, further comprising an electric conductor layer form on the diamond crystal.

56. An ultraviolet light-emitting device according to claim 55, wherein the electrical conductor layer is formed by a surface hydrogen-termination treatment on the diamond crystal.

57. An ultraviolet light-emitting device according to claim 1, wherein the diamond crystal is a p-type semiconductor containing boron.

58. An ultraviolet light-emitting device according to claim 57, wherein the content of boron is no more than 40 ppm as measured through infrared spectroscopy.

59. An ultraviolet light-emitting device according to claim 57, wherein the content of boron is no more than $2\times10^{19}$ atoms/cm$^3$ as measured by SIMS measurement.

60. A current injection-type diamond ultraviolet light-emitting device which emits light due to excitation by the injection of current, characterized in that the above-mentioned diamond ultraviolet light-emitting device has a luminescent layer comprising a diamond in which occurs an emission such that the free excitation recombination radiation due to excitation by the injection of current is dominant.

61. A current injection-type diamond ultraviolet light-emitting device according to claim 60, wherein the diamond is fabricated by a high-temperature and high-pressure method using a flux with an impurity getter added therein.

62. A current injection-type diamond ultraviolet light-emitting device according to claim 60, wherein the diamond has a concentration of nitrogen that is no more than 10 ppm.

63. A current injection-type diamond ultraviolet light-emitting device according to claim 60, wherein the diamond has a carbon isotope composition ratio comprising $^{12}C$: $^{13}C$ in a range of 1:99 to 99:1.

64. A current injection-type diamond ultraviolet light-emitting device according to claim 60, wherein the diamond comprises a diamond crystal having the {100} growth sector.

65. A current injection-type diamond ultraviolet light-emitting device according to claim 60, wherein the diamond is a p-type semiconductor containing boron.

* * * * *

UNITED STATES PATENT AND TRADEMARK OFFICE
CERTIFICATE OF CORRECTION

PATENT NO.   : 6,433,474 B1
DATED        : August 13, 2002
INVENTOR(S)  : Kenji Horiuchi et al.

It is certified that error appears in the above-identified patent and that said Letters Patent is hereby corrected as shown below:

Column 3,
Line 15, change "1:99to" to -- 1:99 to --

Column 4,
Line 61, change "n" to -- in --

Column 5,
Line 44, change "mount" to -- amount --

Signed and Sealed this

Eighteenth Day of February, 2003

JAMES E. ROGAN
*Director of the United States Patent and Trademark Office*